(12) United States Patent
Agarwal et al.

(10) Patent No.: US 7,868,640 B2
(45) Date of Patent: Jan. 11, 2011

(54) ARRAY-BASED EARLY THRESHOLD VOLTAGE RECOVERY CHARACTERIZATION MEASUREMENT

(75) Inventors: Kanak B Agarwal, Austin, TX (US); Nazmul Habib, South Burlington, VT (US); Jerry D. Hayes, Georgetown, TX (US); John Greg Massey, Jericho, VT (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 12/061,077

(22) Filed: Apr. 2, 2008

(65) Prior Publication Data

US 2009/0251167 A1  Oct. 8, 2009

(51) Int. Cl.
    *G01R 31/26*  (2006.01)
(52) U.S. Cl. .......... 324/765; 324/769; 324/763
(58) Field of Classification Search ............ 324/765, 324/769–770, 158.1; 702/64
    See application file for complete search history.

(56) References Cited

U.S. PATENT DOCUMENTS

| | | | |
|---|---|---|---|
| 5,537,054 A * | 7/1996 | Suzuki et al. | 324/770 |
| 5,780,884 A | 7/1998 | Kumagi et al. | |
| 6,275,061 B1 | 8/2001 | Tomita | |
| 6,342,790 B1 * | 1/2002 | Ferguson et al. | 324/765 |
| 6,521,469 B1 | 2/2003 | La Rosa et al. | |
| 6,630,840 B2 | 10/2003 | Tomita | |
| 6,731,179 B2 | 5/2004 | Abadeer et al. | |
| 6,815,970 B2 | 11/2004 | Rost et al. | |
| 6,873,173 B2 | 3/2005 | Kollmer et al. | |
| 6,885,212 B2 | 4/2005 | Yamamoto et al. | |
| 6,985,003 B2 | 1/2006 | Li et al. | |
| 7,038,482 B1 * | 5/2006 | Bi | 324/769 |
| 7,103,861 B2 | 9/2006 | Ang et al. | |
| 7,212,023 B2 * | 5/2007 | Krishnan et al. | 324/769 |
| 7,312,625 B1 | 12/2007 | Paak et al. | |

(Continued)

OTHER PUBLICATIONS

Reisinger, et al., "Analysis of NBTI Degradation- and Recovery-Behavior Based on Ultra Fast $V_T$-Measurements", IEEE 44th Annual International Reliability Physics Symposium, San Jose, 2006, pp. 448-453.

(Continued)

*Primary Examiner*—Ha Tran T Nguyen
*Assistant Examiner*—Arleen M Vazquez
(74) *Attorney, Agent, or Firm*—Mitch Harris, Atty at Law, LLC; Andrew M. Harris; Libby Z. Toub (57) ABSTRACT

A method and test circuit provide measurements to aid in the understanding of time-varying threshold voltage changes such as negative bias temperature instability and positive bias temperature instability. In order to provide accurate measurements during an early stage in the threshold variation, a current generating circuit is integrated on a substrate with the device under test, which may be a device selected from among an array of devices. The current generating circuit may be a current mirror that responds to an externally-supplied current provided by a test system. A voltage source circuit may be included to hold the drain-source voltage of the transistor constant, although not required. A stress is applied prior to the measurement phase, which may include a controllable relaxation period after the stress is removed.

20 Claims, 4 Drawing Sheets

U.S. PATENT DOCUMENTS

| | | | |
|---|---|---|---|
| 7,423,446 | B2 | 9/2008 | Agarwal |
| 7,525,333 | B1* | 4/2009 | Bertin ..................... 324/769 |
| 7,589,550 | B2 | 9/2009 | Smith |
| 7,609,080 | B2 | 10/2009 | Miller et al. |
| 2005/0189960 | A1 | 9/2005 | Tajima |
| 2006/0261840 | A1* | 11/2006 | Hoon et al. ............... 324/769 |
| 2009/0167429 | A1* | 7/2009 | Reddy et al. ................ 330/2 |

OTHER PUBLICATIONS

Bhushan, et. al. "Ring Oscillator Based Technique for Measuring Variability Statistics", International Conference on Microelectronic Test Structures Mar. 6-9, 2006, IEEE Press 2006 pp. 87-92.

U.S. Appl. No. 11/736,146, filed Apr. 17, 2007, Agarwal, et al.

U.S. Appl. No. 11/422,913, filed Jun. 8, 2006, Agarwal, et al.

U.S. Appl. No. 11/462,186, filed Aug. 3, 2006, Agarwal, et al.

U.S. Appl. No. 11/961,442, filed Dec. 20, 2007, Agarwal, et al.

U.S. Appl. No. 11/961,520, filed Dec. 20, 2007, Agarwal, et al.

Keane, et al., "An On-chip NBTI Sensor for Measuring PMOS Threshold Voltage Degradation", International Symposium on Low Power Electronics and Design 2007, pp. 189-194, Portland, OR.

Earle, et al., "Compact In-Situ Sensors for Monitoring Negative-Bias-Temperature-Instability Effect and Oxide Degradation", IEEE ISSC Conference 2008, pp. 410-411 and 623, San Francisco, CA.

Ketchen, et al., "Ring Oscillator Based Test Structure for NBTI Analysis", IEEE International Conference on Microelectronic Test Structures 2007, pp. 42-47, Tokyo, Japan.

Kim, et al., "Silicon Odometer: An On-Chip Reliability Monitor for Measuring Frequency Degradation of Digital Circuits", 2007 Symposium on VLSI Circuits, Digest of Technical Papers, pp. 122-123, Kyoto Japan.

Kim, et al., "", IEEE Journal of Solid-State Circuits, vol. 43, No. 4, pp. 874-880, Apr. 2008.

Shen, et al., "Characterization and Physical Origin of Fast $V_{TH}$ Transient in NBTI of pMOSFETs with SiON Dielectric", IEDM Technical Digest, pp. 333-336, Dec. 2006.

Office Action in U.S. Appl. No. 12/147,290 mailed Dec. 17, 2009.

\* cited by examiner

ARRAY-BASED EARLY THRESHOLD VOLTAGE RECOVERY CHARACTERIZATION MEASUREMENT

BACKGROUND OF THE INVENTION

1. Field of the Invention

The present invention is related to device characterization methods and circuits, and more particularly to array-based techniques for measuring early threshold voltage recovery.

2. Description of Related Art

As geometry and power supply voltages in very large-scale integrated circuits (VLSI) such as semiconductor memories and microprocessors are decreased, the effect of threshold voltage variation has become increasingly significant. Not only do process variation changes in threshold voltage cause variation from device-to-device, but effects such as negative bias temperature instability (NBTI) and positive bias temperature instability (PBTI) cause changes in performance that are time and stress dependent. The mechanisms behind NBTI and PBTI are not fully understood, and measurements of their effects have been limited by their time-dependent nature.

NBTI effects are seen when a negative gate voltage stress is applied to a P-channel metal-oxide semiconductor (MOS) transistor, and the effects diminish rapidly during the recovery time immediately following removal of the stress. Similarly, PBTI effects are seen in N-channel MOS devices. Therefore, in order to properly characterize NBTI/PBTI effects and gain insight thereby into the mechanisms causing NBTI/PBTI, it is desirable to measure threshold voltage not only during the application of the stress and after removal of the stress, but to characterize the threshold voltage variation during the time period between removal of the stress and recovery of the initial (non-stressed) threshold voltage.

Present measurement techniques provide threshold voltage observation in the range of 100 microseconds and later by measuring the drain current of a transistor having fixed drain and source voltages and responding to a step voltage at the gate of the transistor that transitions from the stressed condition (negative gate voltage) to an unstressed condition. The NBTI/PBTI effects are masked during the early portion of such measurements by the delays in both the operation of the transistor, i.e., delays due to the transition time of the transistor, and the test instrumentation, i.e., the delays inherent in making a current measurement. It would be desirable to eliminate as many of the measurement delays as possible. Further, current-based measurement of threshold voltage relies on a model of the drain current versus gate voltage in order to determine the actual change in threshold voltage due corresponding to the drain current changes. As a result, drain current-based NBTI/PBTI measurements are typically not reflective of the true dynamic operation of logic circuits and the transient nature of the effect of NBTI/PBTI on logic circuits. Finally, drain current-based measurements typically operate the drain-source terminals near their full on-state current level, which makes it difficult to simultaneously test a large number of devices in an array due to the high current requirement when multiple devices are turned on.

Therefore, it would be desirable to provide threshold voltage characterization that measures early effects of threshold voltage change due to NBTI and PBTI. It would further be desirable to provide such threshold voltage characterization that measures the NBTI/PBTI effect under transistor terminal conditions reflecting actual operating conditions in a logic circuit. It would further be desirable to perform such measurements in an array environment, so that multiple measurements can be performed across a die.

BRIEF SUMMARY OF THE INVENTION

Early effects of threshold voltage change due to NBTI/PBTI, under conditions reflecting actual operating conditions of devices in a logic circuit, are measured via a characterization circuit and a test methodology. The characterization circuit may be included within a characterization array.

A current-generating circuit integrated on a substrate with a device under test is is enabled to provide a constant drain-source current to the device under test. The gate voltage is set to a predetermined measurement value, and a voltage source may also be included to maintain the drain-source voltage constant. A time varying source voltage waveform is measured and a time varying threshold voltage characteristic is determined from the source voltage waveform.

To measure NBTI/PBTI effects, a stress gate voltage is applied to the gate of the device under test. Drain and source voltage may also be pre-set to alternate values during the stress period. After the stress voltage(s) is/are removed, a measurement gate voltage is applied and the constant drain-source current applied while the source voltage waveform is measured.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to test circuits and methodologies for measuring time-variant effects on threshold voltage due to stress. In particular, the present invention provides information on the early stages of recovery from NBTI and PBTI in the sub-microsecond range, so that the causes and effects of NBTI and PBTI can be studied in further detail. The circuits and methods of the present invention can also be used to study other time-variant effects on threshold voltage. The method may be a computer-performed method embodied in a computer program having program instructions for controlling a test system and characterization array to carry out the method. The present invention overcomes difficulties in measuring the early portions of threshold voltage recovery by including a current-generating circuit on the same substrate as the device under test. Generally, the current source and device under test will be integrated on the same die. By co-locating the current source used to set the drain-source current of the device under test during threshold voltage measurement with the device under test itself, parasitic impedances that would otherwise affect the response of the current source to changes in the device under test and initial application of current are overcome. Therefore, the present invention provides for threshold voltage waveform information that is accurate much earlier than data available from previous test circuits and measurement methodologies.

The present invention measures the source voltage of a device under test while maintaining the gate of the device under test at a constant voltage and providing a constant current from the drain terminal to the source terminal of the device under test. U.S. Published Patent Application US20080030220-A1, filed on Aug. 3, 2006 having at least one common inventor and assigned to the same Assignee, discloses the use of source voltage measurements to study threshold voltage variation and is incorporated herein by reference. The above-incorporated U.S. patent application provides exact threshold voltage values for studying device-to-device variation and holds the drain-source voltage constant in order to fully characterize the device under test. In the present invention, it is not necessary to maintain the drain-source voltage constant, and since the measurement is of a dynamic waveform, it is also not necessary to compute the actual threshold voltage to study the dynamic variation of threshold voltage, as the source voltage and threshold voltage differ only by a constant, as explained in detail in the above-incorporated U.S. patent application. However, the drain-source voltage can be maintained at a constant level and the actual threshold voltage computed from an offset determined by fully characterizing at least one device under test, in order to provide further information on static threshold voltage values. The techniques of the present invention are particularly useful when applied in combination with the techniques disclosed in the above-incorporated U.S. patent application, so that both the setting of input conditions to and output measurements from the device under test are isolated from off-chip test equipment, thus isolating the device under test from the influences of probe and line impedances that introduce delays and/or error in the measurements.

Figure 1:
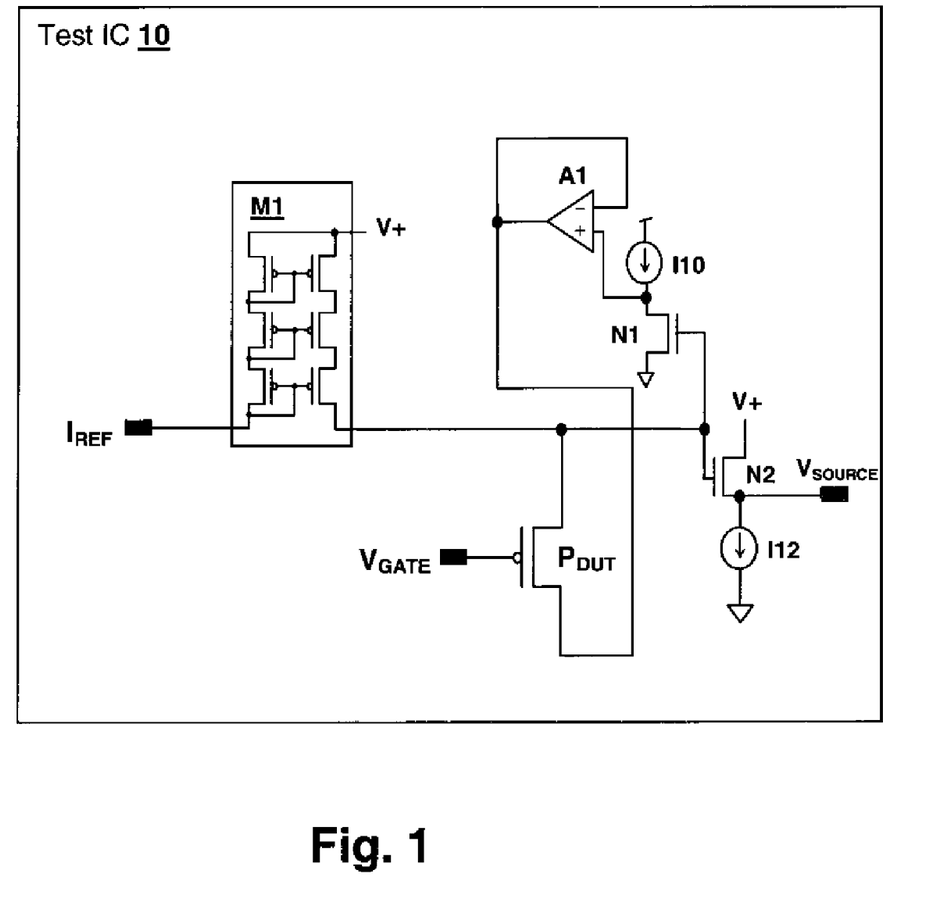
FIG. 1 is a schematic diagram of a test circuit according to an embodiment of the present invention.

Referring now to FIG. 1, a test integrated circuit 10 in accordance with an embodiment of the present invention is shown. Test integrated circuit 10 includes a device under test $P_{DUT}$ for which a NBTI recovery measurement waveform is generated. An N-channel device can be alternatively used to study PBTI. In general, the technique employed is the same: after initial stress conditions have been imposed and then ended, the dynamic change in threshold voltage of device under test $P_{DUT}$ is observed while device under test $P_{DUT}$ is operated according to a fixed gate voltage set via a test pad $V_{GATE}$ and a fixed (constant) drain-source current generated locally within test integrated circuit 10. To generate the constant current, which is supplied to the source terminal of device under test $P_{DUT}$ in the exemplary embodiment, but may be alternative supplied from the drain terminal in other circuit configurations, a current mirror M1 is included within test integrated circuit 10. Current mirror M1 is controlled by an externally-supplied current at test pad $I_{REF}$, which is provided for connection to an external current source. While current control is illustrated and current mirror M1 used for that purpose, it is understood that alternative techniques for providing a local current source may alternatively be employed within test integrated circuit, including voltage controlled current sources or fixed current sources. Including of current mirror M1, or another local current-generating device, dramatically improves the response time of the test circuit, as the internal impedances of the signal paths and shunt capacitances are much smaller within test integrated circuit 10 than along the external tester connection paths, which include probes, test pads and the like. Therefore, when measurement is initiated after the stress is removed, current mirror M1 will be stably providing a constant current through device under test $P_{DUT}$ much earlier than would otherwise be possible.

The source terminal of device under test $P_{DUT}$ is provided to a source follower circuit formed by transistor N2 and current source I12. Transistor N2 is generally a thick oxide device having a long channel and operated in the saturation region. Current source I12 fixes the channel current $I_{DS}$ through transistor N2. During measurement, since the voltage at the gate of device under test $P_{DUT}$ is fixed at a constant voltage supplied through test pad $V_{GATE}$ and the drain-source current of device under test $P_{DUT}$ is held constant, dynamic changes in the threshold voltage of device under test $P_{DUT}$ appear directly as an opposite change in source voltage of device under test $P_{DUT}$ and therefore as an opposite change in the voltage provided at test pad $V_{SOURCE}$. A threshold voltage waveform can then be computed by inverting the waveform captured from test pad $V_{SOURCE}$ by a test system and may be adjusted for offset as described in the above-incorporated U.S. patent application to obtain an absolute threshold voltage waveform, if needed.

While not required to provide an early indication of threshold voltage change, the drain-source voltage of device under test $P_{DUT}$ can be further controlled to maintain the drain-source voltage of device under test $P_{DUT}$ at a constant level. Amplifier A1 provides a voltage source that maintains the drain-source voltage of device under test $P_{DUT}$ constant by offsetting the source voltage at the gate of a transistor N1 by a voltage determined by the magnitude of current source I10 and the channel resistance of transistor N1. Since the drain terminal of device under test $P_{DUT}$ is connected to the inverting input and the output of amplifier A1, amplifier A1 forms a buffer that applies a voltage equal to the source voltage of device under test $P_{DUT}$ plus the offset provided by transistor N1 and current source I10, maintaining the drain-source voltage of device under test $P_{DUT}$ equal to the offset.

Figure 2:
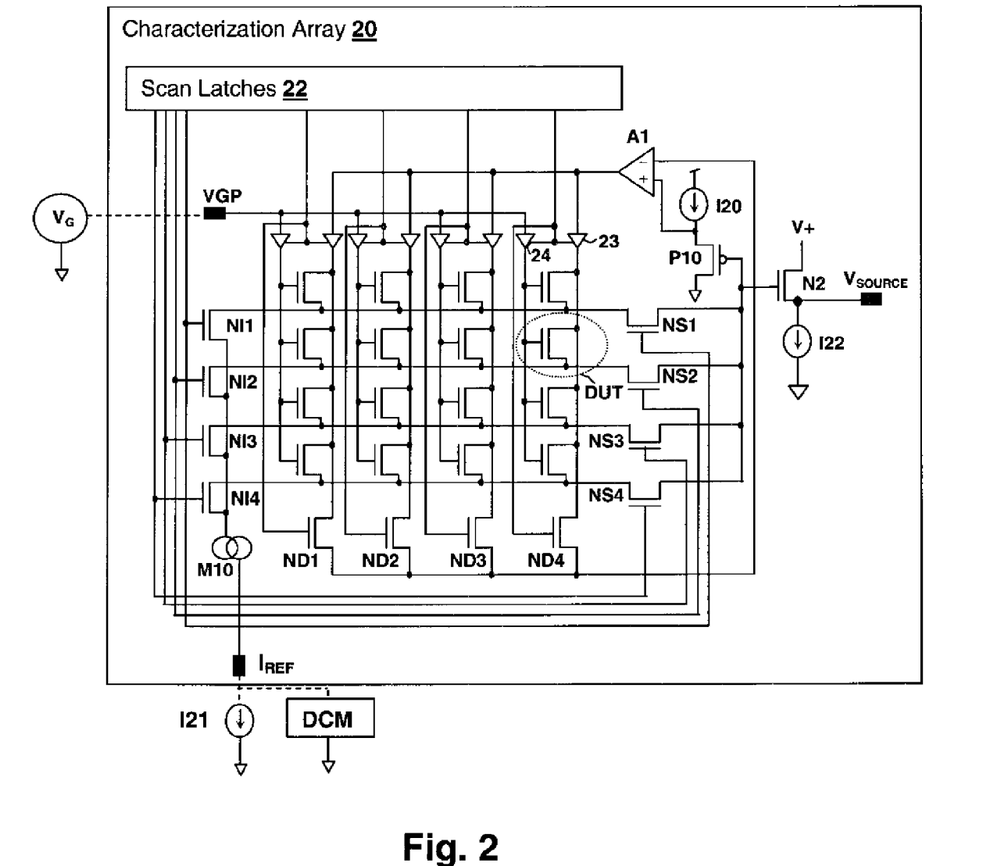
FIG. 2 is a schematic diagram of a characterization array in accordance with an embodiment of the present invention.

Referring now to FIG. 2, a characterization array 20 in accordance with an embodiment of the present invention is shown. Characterization array 20 is a test integrated circuit integrated on a die, a wafer kerf or other integrated circuit location that may be experimental only, or occupy one or more die or kerf locations in a production wafer. An array of transistors including device under test DUT is operated in a controlled manner via signals provided by scan latches 22. Although the exemplary embodiment uses scan latches 22 to apply the control signals, it is understood that registers controlled via a control interface or other suitable circuit may be provided to control the operation of characterization array 20. Further, it is understood that although the exemplary embodiment supplies signals to external equipment via pads VGP, $I_{REF}$ and $V_{SOURCE}$, one or more of the external devices used to operate and evaluate device under test DUT may be integrated within characterization array 20. For example, any or all of voltage source $V_G$, current source I21 and a voltage measurement circuit for measuring the voltage at pad VSP can be integrated on a wafer including characterization array 20. Stress may be manipulated by adjusting the voltage applied at test pad VGP and optionally by other circuitry added to manipulate the drain and/or source voltages of transistors within the array.

Signals provided from scan latches 22 select a unique row and column associated with one of the transistors, e.g., device under test DUT, illustrated as an N-channel FET. For N-channel FETs, PBTI is the effect that is studied, but an NBTI measurement circuit can be similarly constructed for NBTI measurements in the manner illustrated in FIG. 1. Device under test DUT may be of either P-type or N-type. The selection of a row is made by a logical "1" applied to the gate of one of current steering transistors NI1-NI4 and simultaneously to a gate of a corresponding one of source voltage sense transistors NS1-NS4. Scan latches 22 are programmed such that only one row is selected at a time, i.e., all gates of transistors NI1-NI4 and NS1-NS4 are set to logical "0" other than the gates corresponding to the selected row. The selection of a column is made by enabling a buffer, e.g., buffer 24 that applies a reference gate voltage provided at pad VGP to the gates of all of the transistors in a column of the transistor array. A corresponding buffer 23 is also enabled and applies the output of amplifier A1 to the drain of each transistor in the selected column. The gate of a corresponding drain voltage sense transistor ND1-ND4 for the selected column is also set to a logic "1", and provides a sense path for sensing the drain voltage of a column at the inverting input of amplifier A1. Scan latches 22 are programmed such that only one column is selected at a time, i.e., all buffer enable inputs and drain voltage sense transistor ND1-ND4 gates are set to logical "0" other than the enable inputs of the buffers corresponding to the selected column and the gate of the corresponding drain voltage sense transistor ND1-ND4.

Characterization array includes a current mirror M10 having a function similar to that described above with respect current source M1 to FIG. 1, which forces the drain-source current of the selected device under test DUT to a constant level after stress is removed. The source follower circuit comprising transistor N2 and current source I22 having a function similar to that described above with reference to current source I12 of FIG. 1 is also included within characterization array 20, and optionally the voltage source provided by amplifier A1 may be included to force the drain-source voltage ($V_{DS}$) to be a constant value for each selected transistor in the array. For example, when device under test DUT is selected by enabling buffers 23 and 24 and transistors ND4, NI2 and NS2, transistor ND4 applies the drain voltage of device under test DUT to the inverting input of amplifier A1. Simultaneously, transistor NS2 applies the source voltage of transistor DUT to the gate of source-follower transistor P10, which controls the voltage at the non-inverting input of amplifier A1. The feedback loop acts to hold the drain-source voltage of transistor DUT constant by tracking any changes in the source voltage sensed from the selected row and adjusting the drain voltage supplied to the transistors in the column by an equal amount. Only one of the transistors in the array is conducting current at any time. Current provided from the output of A1 is directed through buffer 23 through the channel of transistor DUT and through transistor NI2 to current mirror M10, which is controlled by an external stable current source I21. Since the current output of amplifier A1 is supplied to the drains of each transistor in a selected column, but only one selected row has a return path enabled via one of transistors NI1-NI4, only one device is selected for characterization for each valid combination of row and column selection signals provided from scan latches 22. Alternatively, if the drain-source voltage control voltage source formed by amplifier A1 is omitted, then the inputs to buffers 23 can be connected to a constant voltage source for supplying the drain voltage to selected device under test DUT.

The above-described characterization array 20 thus provides a mechanism for uniquely selecting each device in the array and sensing changes in the source voltage $V_S$ at pad $V_{SOURCE}$ due to application of the current supplied by current mirror M10 after stress is applied to test pad VGP and optionally to other terminals of device under test DUT prior to measurement. By setting different valid selection combinations in scan latches 22, each transistor in the array is selected and waveform of values of $V_S$ is measured and collected, for example by an external computer-controlled digital voltmeter (DVM). The threshold voltage waveform is the invert of the source voltage waveform, since changes in the threshold voltage of device under test DUT cause an opposing change in the source voltage of device under test DUT. If absolute threshold voltage values are needed, the difference between $V_S$ and $V_T$ need only be measured for one device, by fully characterizing the $I_{DS}$ versus $V_{GS}$ behavior of one of the transistors in the array, e.g. transistor DUT and then subtracting the measured offset from inverted versions of the source voltage waveforms.

Figure 3:
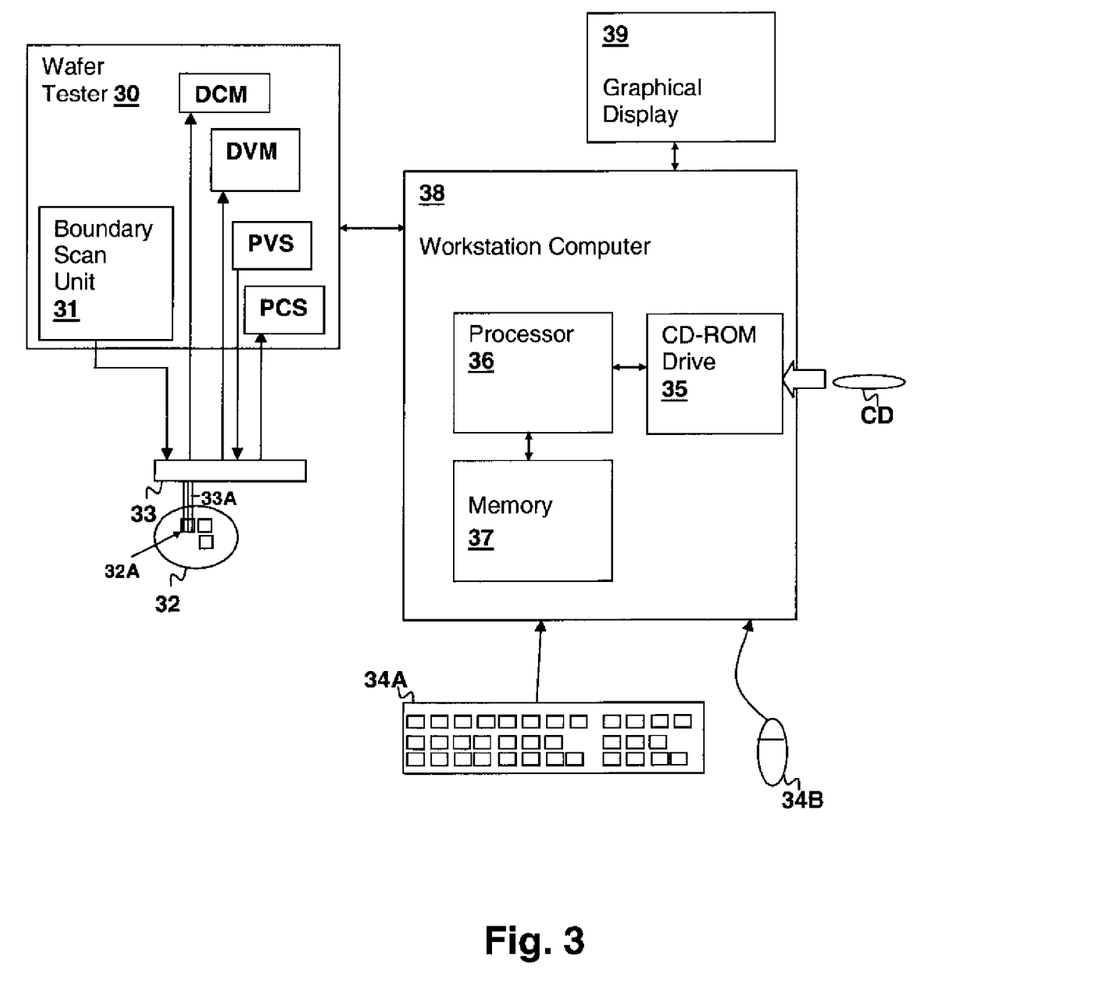
FIG. 3 is a pictorial diagram of a wafer test system in which methods in accordance with an embodiment of the present invention are performed.

Referring now to FIG. 3, a wafer test system in which a method according to an embodiment of the invention is performed, is shown. A wafer tester 30 includes a boundary scan unit 31 for providing stimulus to a die or kerf circuit 32A on a wafer under test 32, via a probe head 33 having electrical test connections 33A to die 32A. Wafer tester 30 also includes a digital voltmeter DVM, which may be part of a parametric measurement unit that also includes a programmable voltage source PVS, a programmable current source PCS, and a digital current meter DCM, that are all coupled to die 32A via probe head 33 electrical test connections 33A. The output of programmable voltage source is connected to pad VGP, the output of programmable current source PCS is connected to pad $I_{REF}$ and the input of digital voltmeter DVM is connected to pad $V_{SOURCE}$.

A workstation computer 38, having a processor 36 coupled to a memory 37, for executing program instructions from memory 37, wherein the program instructions include program instructions for executing one or more methods in accordance with an embodiment of the present invention, is coupled to wafer tester 30, whereby the measurements described above are performed and measurements collected and stored in memory 37 and/or other media storage such as a hard disk. A CD-ROM drive 35 provides for import of program instructions in accordance with embodiments of the present invention that are stored on media such as compact disc CD. Workstation computer 38 is also coupled to a graphical display 39 for displaying program output such as the threshold voltage waveform for devices in the characterization array provided by embodiments of the present invention. Workstation computer 38 is further coupled to input devices such as a mouse 34B and a keyboard 34A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 38. Further, workstation computer 38 may be coupled to wafer tester 30 by such a network connection.

While the system of FIG. 3 depicts a configuration suitable for sequential test of a plurality of dies on a wafer, the depicted system is illustrative and not a limitation of the present invention. Probe head 33 may be a multi-die full wafer probe system, or may comprise multiple probe heads for simultaneously testing multiple wafers on a single or multiple die basis. Additionally, while boundary scan control of the characterization array is illustrated, the techniques of the present invention may also be applied to execution of test code from a processor incorporated on wafer 32 with appropriate current and voltage sources and voltage measurement circuitry provided on wafer 32, as well. The resultant generated display or data exported from workstation computer 38 may take the form of graphical depictions of the threshold voltage waveform variation across the characterization array, or may graphical or numerical statistical distribution information that describes changes in threshold voltage over time.

Figure 4:
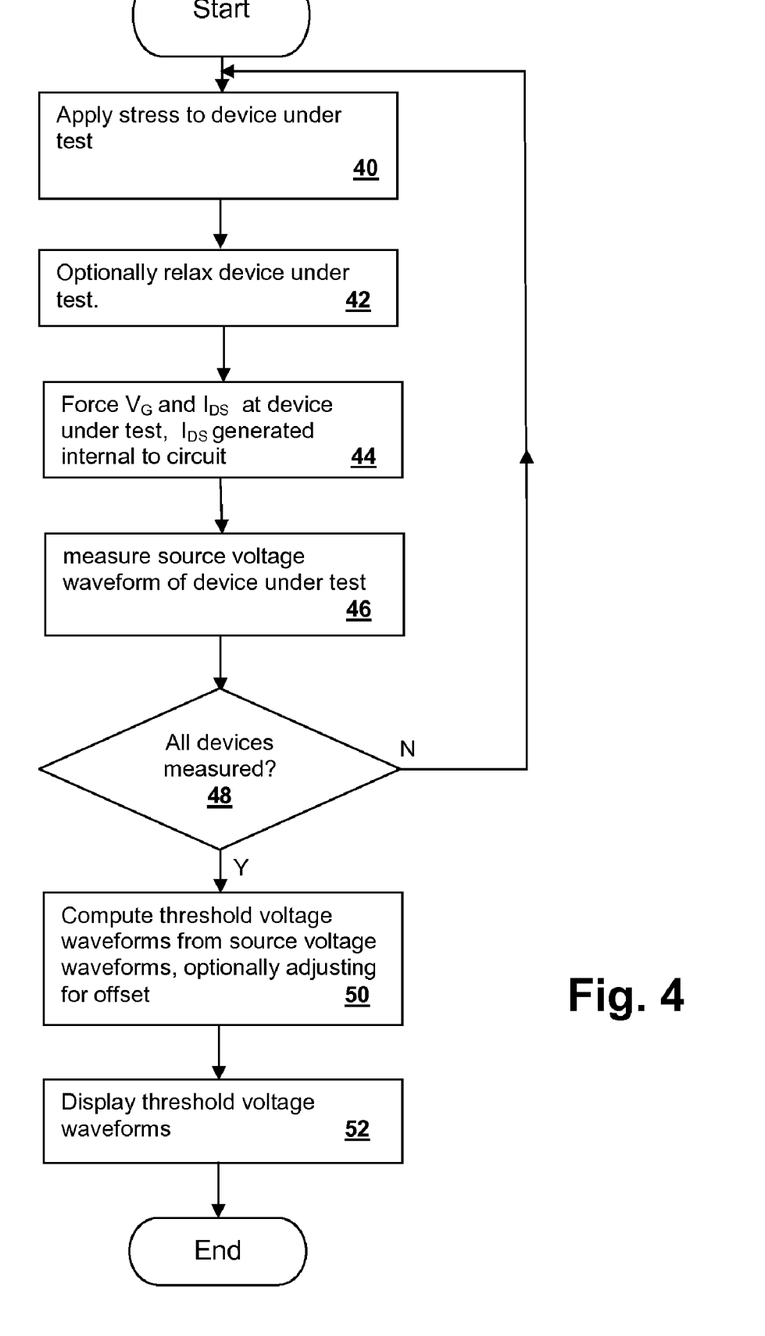
FIG. 4 is a flow chart of a method in accordance with an embodiment of the present invention.

Referring now to FIG. 4, a method in accordance with an embodiment of the invention is depicted in a flowchart. First, stress is applied to the device under test (step 40). Next, the device under test can be selected for relaxation prior to test (step 42). The gate voltage is forced and the internally-generated drain-source current is applied to the device under test (step 44). The source voltage waveform of the selected device is measured (step 46). Until the source voltage has been measured for all devices (decision 48), steps 42-46 are repeated, selecting a different device each repetition of step 42. After the source voltage waveforms for all of the devices have been captured, the threshold voltage waveform may be computed, optionally correcting for the offset between the source voltage waveform measured in step 46 using an offset measured for a fully-characterized device (step 50). Finally, the resulting threshold voltage waveforms are displayed (step 52).

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for measuring time-varying change in threshold voltage in a device under test, the method comprising:
   setting a predetermined measurement gate voltage of the device under test;
   generating a constant current between the drain and source of the device under test from a current source integrated on a substrate with the device under test;
   measuring a time-varying source voltage waveform at a source terminal of said device under test while applying the predetermined measurement gate voltage and the constant current to said device under test; and
   deriving an indication of a time-varying change in threshold voltage of the device under test using values of the measured source voltage waveform.

2. The method of claim 1, wherein the providing a constant current is performed by a current mirror, and wherein the method further comprises providing a test current from a tester external to the substrate, whereby the current mirror reduces an impact of circuit impedances between the tester and the device under test.

3. The method of claim 1 further comprising maintaining a constant drain-to-source voltage of the device under test during the generating and measuring.

4. The method of claim 1, wherein the device under test is a selected one of a plurality of devices in a characterization array, and wherein the method further comprises:
   selecting the device under test from among the plurality of devices; and
   repeating the setting, providing controlling, measuring and computing for the plurality of devices to determine a variation in the time-varying change in threshold voltage from device to device.

5. The method of claim 1, further comprising prior to the setting a predetermined measurement gate voltage, setting a predetermined stress gate voltage of the device under test, and wherein the time-varying change in threshold voltage is a change due to recovery from a device stress caused by the stress gate voltage.

6. The method of claim 5, further comprising prior to the setting a predetermined measurement gate voltage and subsequent to the setting a predetermined stress gate voltage, setting a predetermined relaxation gate voltage of the device under test.

7. A test circuit for measuring time-dependent threshold voltage variation, comprising:
   a device under test;
   a voltage source for applying a predetermined gate voltage to a gate of the device under test;
   a current source integrated on a substrate with the die under test for generating a constant current between a drain and source of the device under test, wherein the current source is connected to at least one of a drain or source of the device under test, wherein the current source is coupled to a control terminal; and
   a tester external to the die and connected to the control terminal for controlling the current source and measuring a time-varying source voltage waveform of the device under test while applying the constant current and the predetermined gate voltage to said device under test, whereby a time-varying change in threshold voltage of the device under test is determined from the measured source voltage waveform.

8. The test circuit of claim 7, wherein the current source is a current mirror having an input coupled to the control terminal, and wherein the tester provides a constant current to the current mirror to control the current between the drain and source of the device under test.

9. The test circuit of claim 7, further comprising a voltage source coupled to the drain and source of the device under test for maintaining a constant voltage across the drain and source of the device under test during the measuring of the time-varying source voltage waveform.

10. The test circuit of claim 7, further comprising source follower having an input connected to the source terminal of the device under test, and wherein the tester has an input coupled to an output of the source follower for measuring the time-varying source voltage waveform of the device under test.

11. The test circuit of claim 7, wherein the tester has a drain voltage output coupled to a gate input voltage terminal coupled to the gate of the device under test, and wherein the tester applies a stress gate voltage to the device under test prior to applying a measurement gate voltage to the device under test, and wherein the tester measures the time-varying source voltage waveform after removing the stress gate voltage and applying the measurement gate voltage, whereby an effect of device stress caused by application of the stress gate voltage is observed in the time-varying source voltage waveform.

12. The test circuit of claim 11, wherein the tester applies a predetermined relaxation gate voltage to the device under test after removing the stress gate voltage and prior to applying the measurement gate voltage.

13. The test circuit of claim 7, wherein the test circuit comprises:
   an array of devices from which the device under test is selected; and
   logic responsive to a test interface for selecting the device under test from the array of devices.

14. A test workstation computer system including a memory for storing program instructions for characterizing time-dependent threshold voltage variation within an array, a processor for executing said program instructions, and an interface to a characterization array circuit, wherein said program instructions comprise program instructions for:

selecting a device within the array as a device under test using the interface;

controlling the interface to enable a current source integrated within the characterization array that generates a predetermined current between the drain and source of the device under test and to enable another circuit that maintains a predetermined voltage between the drain and source of the device under test;

measuring a time-varying source voltage waveform at a source terminal of said device under test while applying the predetermined current and the predetermined voltage to said device under test;

repeating said program instructions for selecting, said providing and said measuring for multiple devices within said array to obtain a set of source voltage waveform measurements; and computing a time-varying change in threshold voltage for said multiple devices from said set of source voltage waveform measurements.

15. The test workstation computer system of claim 14, wherein the program instructions further comprise instructions for controlling the interface enable a circuit that maintains a constant voltage between the drain and source of the device under test.

16. The test workstation computer system of claim 14, wherein the program instructions further comprise instructions for controlling the interface to apply a stress gate voltage to the device under test prior to applying a measurement gate voltage to the device under test, and wherein the program instructions for measuring measure the time-varying source voltage waveform after removing the stress gate voltage and applying the measurement gate voltage, whereby an effect of device stress caused by application of the stress gate voltage is observed in the time-varying source voltage waveform.

17. The test workstation computer system of claim 16, wherein the program instructions further comprise program instructions for controlling the interface to apply a relaxation gate voltage to the device under test prior to applying the measurement gate voltage to the device under test and after applying the stress gate voltage to the device under test.

18. A computer program product comprising a non-transitory computer-readable storage media storing program instructions for characterizing time-dependent threshold voltage variation within an array for execution by a test workstation computer system coupled to an interface of a characterization array circuit, wherein said program instructions comprise program instructions for:

selecting a device within the array as a device under test using the interface; controlling the interface to enable a current source integrated within the characterization array that generates a predetermined current between the drain and source of the device under test and to enable another circuit that maintains a predetermined voltage between the drain and source of the device under test; measuring a time-varying source voltage waveform at a source terminal of said device under test while applying the predetermined current and the predetermined voltage to said device under test;

repeating said program instructions for selecting, said providing and said measuring for multiple devices within said array to obtain a set of source voltage waveform measurements; and computing a time-varying change in threshold voltage for said multiple devices from said set of source voltage waveform measurements.

19. The computer program product of claim 18, wherein the program instructions further comprise instructions for controlling the interface to apply a stress gate voltage to the device under test prior to applying a measurement gate voltage to the device under test, and wherein the program instructions for measuring measure the time-varying source voltage waveform after removing the stress gate voltage and applying the measurement gate voltage, whereby an effect of device stress caused by application of the stress gate voltage is observed in the time-varying source voltage waveform.

20. The computer program product of claim 19, wherein the program instructions further comprise program instructions for controlling the interface to apply a relaxation gate voltage to the device under test prior to applying the measurement gate voltage to the device under test and after applying the stress gate voltage to the device under test.

* * * * *